US009501133B2

(12) United States Patent
Cyrusian

(10) Patent No.: US 9,501,133 B2
(45) Date of Patent: *Nov. 22, 2016

(54) METHOD AND APPARATUS FOR TRANSITIONING A DEVICE BETWEEN OPERATING STATES TO CONTROL POWER CONSUMED BY THE DEVICE

(71) Applicant: Marvell World Trade LTD., St. Michael (BB)

(72) Inventor: Sasan Cyrusian, Scotts Valley, CA (US)

(73) Assignee: Marvell World Trade Ltd., St. Michael (BB)

( * ) Notice: Subject to any disclaimer, the term of this patent is extended or adjusted under 35 U.S.C. 154(b) by 102 days.

This patent is subject to a terminal disclaimer.

(21) Appl. No.: 14/492,384

(22) Filed: Sep. 22, 2014

(65) Prior Publication Data

US 2015/0012770 A1 Jan. 8, 2015

Related U.S. Application Data

(63) Continuation of application No. 14/070,889, filed on Nov. 4, 2013, now Pat. No. 8,841,961, which is a continuation of application No. 13/323,654, filed on Dec. 12, 2011, now Pat. No. 8,575,968.

(60) Provisional application No. 61/421,784, filed on Dec. 10, 2010.

(51) Int. Cl.
*G06F 1/00* (2006.01)
*G06F 1/32* (2006.01)
(Continued)

(52) U.S. Cl.
CPC ........... *G06F 1/3287* (2013.01); *G06F 1/3234* (2013.01); *H03F 3/2173* (2013.01); *H03F 2200/78* (2013.01)

(58) Field of Classification Search
CPC .................................................. G06F 1/3203

USPC ......................................................... 713/324
See application file for complete search history.

(56) References Cited

U.S. PATENT DOCUMENTS 5,289,051 A 2/1994 Zitta
5,300,823 A 4/1994 Ihara
(Continued)

FOREIGN PATENT DOCUMENTS

CN 101207771 A 6/2008
CN 101277095 A 10/2008
(Continued)

OTHER PUBLICATIONS

International Search Report and Written Opinion for PCT Application No. PCT/US2012064489 mailed Jun. 8, 2012; 9 pages.
(Continued)

*Primary Examiner* — Suresh Suryawanshi

(57) ABSTRACT

A method including: accounting for a transition time for a device to transition between two of first, second, and powered off states; generating a control signal based on the transition time; receiving, at the device and from a processor, an output signal and the control signal; and consuming power, via the device, while operating in the first state and the second state. The method further includes: in response to the control signal, transitioning the device to the second state based on a frequency of the output signal or the control signal; subsequent to transitioning to the second state, performing a function based on the first output signal; and subsequent to performing the function, generating an output via the device; generating a feedback signal based on the output; and based on the feedback signal, transitioning the device to either the first state or the powered off state.

23 Claims, 4 Drawing Sheets

(51) Int. Cl.
*H03M 1/12* (2006.01)
*H03F 3/217* (2006.01)

(56) References Cited

U.S. PATENT DOCUMENTS

| | | | |
|---|---|---|---|
| 5,451,897 A | 9/1995 | Komuro | |
| 5,600,269 A * | 2/1997 | Song et al. | 327/52 |
| 5,670,906 A * | 9/1997 | Roohparvar | 327/534 |
| 6,788,239 B2 * | 9/2004 | Suzuki et al. | 341/159 |
| 6,803,832 B2 | 10/2004 | Pigott | |
| 7,301,374 B2 * | 11/2007 | Park | 327/77 |
| 7,567,135 B2 * | 7/2009 | Rogers et al. | 331/48 |
| 7,570,190 B1 * | 8/2009 | Pagones et al. | 341/155 |
| 7,586,373 B2 | 9/2009 | Kim | |
| 7,589,559 B2 | 9/2009 | Shim et al. | |
| 7,911,237 B2 | 3/2011 | Maone | |
| 7,936,180 B2 | 5/2011 | Chao et al. | |
| 8,063,696 B2 | 11/2011 | Shinmyo | |
| 8,575,968 B2 | 11/2013 | Cyrusian | |
| 8,692,576 B2 | 4/2014 | Heath | |
| 8,841,961 B2 | 9/2014 | Cyrusian | |
| 2003/0206038 A1 | 11/2003 | Mueck et al. | |
| 2005/0259497 A1 | 11/2005 | Choi | |
| 2006/0164126 A1 | 7/2006 | Mulder et al. | |
| 2007/0079147 A1 | 4/2007 | Pyeon et al. | |
| 2008/0024178 A1 | 1/2008 | Kim et al. | |
| 2009/0212825 A1 | 8/2009 | Maone | |
| 2011/0204926 A1 | 8/2011 | Inoue | |
| 2012/0126859 A1 | 5/2012 | Kawamoto et al. | |

FOREIGN PATENT DOCUMENTS

| | | |
|---|---|---|
| CN | 101297483 A | 10/2008 |
| CN | 101523725 A | 9/2009 |
| EP | 1519488 A2 | 3/2005 |
| WO | WO-2012079090 A2 | 6/2012 |

OTHER PUBLICATIONS

Chinese Office Action and Search Report for related Chinese Application No. CN2011800597483 dated Sep. 29, 2015; 7 pages.

* cited by examiner

FIG. 2

METHOD AND APPARATUS FOR TRANSITIONING A DEVICE BETWEEN OPERATING STATES TO CONTROL POWER CONSUMED BY THE DEVICE

CROSS REFERENCE TO RELATED APPLICATIONS

The present disclosure is a continuation of U.S. patent application Ser. No. 14/070,889 (now U.S. Pat. No. 8,841, 961), filed Nov. 4, 2013, which is a continuation of U.S. patent application Ser. No. 13/323,654 (now U.S. Pat. No. 8,575,968), filed on Dec. 12, 2011. This application claims the benefit of U.S. Provisional Patent App. No. 61/421,784, filed Dec. 10, 2010. The entire disclosures of the applications referenced above are incorporated herein by reference.

FIELD

The present application relates generally to amplifiers, and more particularly relates to a comparator included in an amplifier and configured to be powered up and powered down by up-stream and down-stream control signals, respectively.

BACKGROUND

Unless otherwise indicated herein, the approaches described in the background section are not prior art to the claims in this application and are not admitted to be prior art by inclusion in the background section.

Audio amplifiers are well known and are used extensively to amplify audio signals. Designing an audio amplifier generally requires balancing two competing concerns. The first concern is fidelity, which relates to the accuracy with which the audio amplifier reproduces the sounds contained in the audio signal. The second concern is power efficiency, which relates to the power consumption of the audio amplifier under various operating conditions.

FIG. 1 is a block diagram of an amplifier 200, such as a class D amplifier. Amplifier 200 may be configured to amplify a set of analog signals for output of the amplified analog signals on a load 210 (i.e., a speaker). More specifically, amplifier 200 may include a signal generator 220 that may be configured to process received digital signals (Dinp, e.g., digital audio signals) and output first and second pulse width modulated (PWM) signals 225a and 225b having different pulse widths, which encode the digital signals. Signal generator 220 may be a Digital Signal Processor (DSP) and may include various circuits, such as a sigma-delta circuit with a subsequent pulse width modulator, for processing the received digital signal and generating the first and second Pulse Width Modulated (PWM) signals. First PWM signal 225a may be output on a positive output 230a and second PWM signal 225b may be output on a negative output 230b. An output stage 235 of the DSP may be configured to transfer either the first PWM signal 225a from positive output 230a onto an output 240 or the second PWM signal 225b from negative output 230b onto output 240. Positive and negative signals applied to switches 245a and 245b place either the first PWM signal or the second PWM signal onto output 240. A pull-up current source 250a may be coupled to positive output 230a and a pull-down current source 250b may be coupled to negative output 230b. Output 240 may be coupled to an input resistor 255 for converting the voltages of the first and second PWM signals to a PWM current signal (Ipwm).

Amplifier 200 includes an integrator 260, which may include a plurality of amplifiers, and is configured to integrate the difference between Ipwm the feedback current (Ifb) of a feedback signal. The result of the integration is provided by integrator 260 to a comparator 265.

The output of the comparator is provided to a one shot circuit 270, which controls an output stage 275 via a set of control signals. A feedback voltage is fed back from the output stage through a feedback resistor 280, which converts the feedback voltage to feedback current Ifb. As described above, the Ifb is fed back into integrator 260, which integrates the difference between currents Ipwm and Ifb. Integrator 260 is also configured to integrate the current accumulated by integration capacitor (Cint) 285, which integrates Ipwm.

For numerous applications of amplifier 200, the circuits to the amplifier operate at relatively high frequency and consume a relatively large amount power. For example, comparator 265 is a relatively high-frequency circuit that consumes a relatively large amount of power. In a variety of devices, such as handheld-mobile devices that use small rechargeable batteries, these relatively high power circuits of an amplifier can cause the charge stored on a battery to be consumed relatively quickly, which is generally not desirable.

Therefore, new amplifiers are needed that have relatively high-power efficiency, and new methods of operation of amplifiers are needed that provide for relatively reduced power consumption, for example, to extend the time a handheld-mobile device may operate between battery charges.

SUMMARY

The present application relates generally to amplifiers, and more particularly relates to a comparator included in an amplifier and configured to be powered up and powered down by up-stream and down-stream control signals, respectively.

An apparatus is provided and includes a processor and a device. The processor is configured to generate an output signal and a control signal. The device is configured to consume power while operating in a first state and a second state. The device consumes less power while in the first state than while in the second state. The processor is configured to: account for a transition time for the device to transition among a powered off state, the first state, and the second state; and generate the control signal based on the transition time. The device is configured to: in response to the control signal, transition to the second state at a speed of periodicity of a periodic signal of the processor; subsequent to the transitioning to the second state, perform a function based on the output signal; and subsequent to performing the function, transition from the second state to either the first state or the powered off state. According to one embodiment, a circuit method includes periodically increasing a tail current of a differential stage of a comparator to periodically power on the differential stage to a power-on state, and periodically decreasing the tail current of the differential stage to periodically power down the differential stage to a low-power state. The periodically increasing of the tail current and the periodically decreasing of the tail current are asynchronous operations for powering on the differential stage to the power-on state and powering down the differential stage to the low-power state.

According to a specific embodiment, the periodically increasing of the tail current and the periodically decreasing of the tail current asynchronously provide for low noise and high speed during signal comparison for powering on the differential stage to the power-on state and powering down the differential stage to the low-power state.

According to another specific embodiment, the circuit method further includes periodically increasing a head current of a second differential stage of the comparator coupled to the first mentioned differential stage to periodically power on the second differential stage to a power-on state, and periodically decreasing the head current of the second differential stage to power down the differential stage to a low-power state. The periodically increasing of the head current and the periodically decreasing of the head current are asynchronous operations for powering on the differential stage to the power-on state and powering down the differential stage to the low-power state.

According to another specific embodiment, the first differential stage is a negative stage of the comparator, and the second differential stage is a positive stage of the comparator.

According to another embodiment, a comparator includes a differential stage, which includes a first pull-down transistor having a first source-drain region, and a second pull-down transistor having second source-drain region, which is coupled to the first source-drain region. The comparator further includes a first current source coupled to the first and the second source-drain regions, and a second current source selectively coupled the first and the second source-drain regions. The comparator further includes a set of switches configured to provide the selective coupling of the second current source. The set of switches is configured to receive a set of upstream control signals for periodically closing the set of switches for powering on the differential stage. The set of switches are configured to receive a set of downstream control signals for periodically opening the set of switches for powering down the differential stage to a low-power state.

According to a specific embodiment, the comparator further includes a second differential stage, which includes a first pull-up transistor having a third source-drain region, and a second pull-up transistor having a fourth source-drain region, which is coupled to the third source-drain region. The comparator further includes a third current source coupled to the third and the fourth source-drain regions, and a fourth current source selectively coupled the third and the fourth source-drain regions. The comparator further includes a second set of switches configured to provide the selective coupling of the fourth current source. The second set of switches is configured to receive the set of upstream control signals for periodically closing the second set of switches for powering on the second differential stage. The second set of switches are configured to receive the set of downstream control signals for periodically opening the second set of switches for powering down the second differential stage to a low-power state.

According to another specific embodiment, the first mentioned differential stage is a negative differential stage, and the second differential stage is a positive differential stage.

According to another specific embodiment, the step of periodically powering on the first mentioned differential stage periodically increases a tail current for low noise and high speed of the comparator during signal comparison.

According to another specific embodiment, the step of periodically powering on the second mentioned differential stage periodically increases a tail current for low noise and high speed of the comparator during signal comparison.

According to another specific embodiment, the first pull-down transistor and the first pull-up transistor are a complimentary input stage. The second pull-down transistor and the second pull-up transistor are a complimentary reference stage.

According to another specific embodiment, the first and the second source-drain regions of the first pull-down and the second pull-down transistor are sources, and the third source-drain region and the fourth source-drain regions are sources.

According to another specific embodiment, a drain of the first pull-down transistor is coupled to a drain of the first pull-up transistor, and the drains of the first pull-down transistor and first pull-up transistor are a first output node.

According to another specific embodiment, a drain of the second pull-down transistor is coupled to a drain of the second pull-up transistor, and the drains of the second pull-down transistor and second pull-up transistor are a second output node.

According to another specific embodiment, the comparator further includes a first resistor and a second resistor disposed in series between the first output node and the second output node. A node between the first resistor and the second resistor is tied to a reference voltage.

According to another specific embodiment, an impedance and the first resistor and the second resistor is less than an impedance of the coupled drain regions of the first pull-up transistor and the first pull-down transistor, and is less than an impedance of the coupled drain regions of the second pull-up transistor and the second pull-down transistor.

According to another specific embodiment, the first resistor and the second resistor tied to the reference voltage inhibit instability in the comparator.

According to another specific embodiment, the first resistor is a transistor and the second resistor is another transistor.

According to another specific embodiment, the source of the first pull-down transistor is coupled to the source of the second pull-down transistor and the first current source, and the sources of the first and the second pull-down transistors are selectively coupled to the second current source.

According to another specific embodiment, the source of the first pull-up transistor is coupled to the source of the second pull-up transistor and the third current source, and the sources of the first and the second pull-up transistors are selectively coupled to the fourth current source.

According to another specific embodiment, the first and the third current sources are low-power current sources, and the second and the fourth current sources are high-power current sources configured to provide higher power than the low-power current sources.

According to another embodiment, a circuit includes a fully differential comparator having a positive output and a negative output, and an output stage coupled to the fully differential comparator and configured to combine the positive output and the negative output to a single output. The circuit further includes a first current source coupled to the fully differential comparator and the output stage, and a second current source selectively coupled the fully differential comparator and the output stage. The circuit further includes a third current source coupled a fully differential comparator and the output stage, and a fourth current source selectively coupled to the fully differential comparator and the output stage. The first and the third current sources are configured to power the fully differential comparator and the output stage in a low-power state. The second and the fourth current sources are configured to periodically power the fully differential comparator and the output stage in a power-on state.

According to a specific embodiment, the fully differential comparator includes a first differential stage and a second differential stage. The first differential stage and the second differential stage form a complimentary input stage including an first input configured to receive an input signal, and a complimentary reference stage including a second input configured to receive a reference voltage.

According to another specific embodiment, the output stage includes a first combiner stage configured to receive a positive input from the fully differential comparator, and a second combiner stage configured to receive a negative input from the fully differential comparator.

According to another specific embodiment, the first combiner stage is configured to be coupled to the first current source and selectively coupled to the second current source, and the second combiner stage is configured to be coupled to the second current source and selectively coupled to the fourth current source.

According to another specific embodiment, the first and the third current sources are low-power current sources, and the second and the fourth current sources are high-power current sources configured to provide higher power than the low-power current sources.

The following detailed description and accompanying drawings provide a more detailed understanding of the nature and advantages of the present disclosure.

BRIEF DESCRIPTION OF THE DRAWINGS

FIG. 2 is a simplified schematic of an amplifier according to one embodiment;

DESCRIPTION

Figure 1:
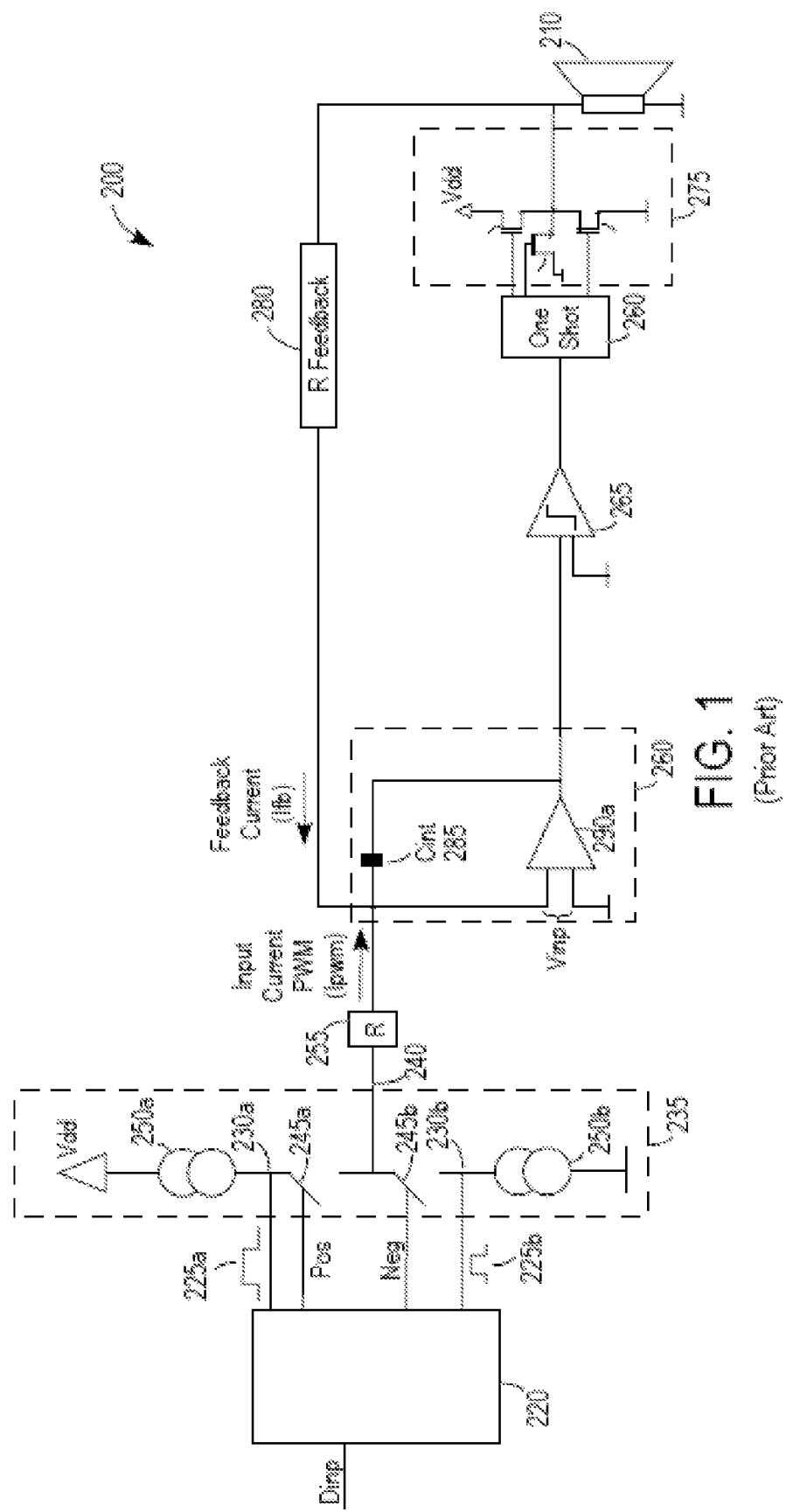
FIG. 1 is a block diagram of an amplifier, such as a class D amplifier.

Embodiments described in present application relate generally provide an amplifier, and more particularly provide a comparator included in an amplifier configured to be powered up and powered down by up-stream and down-stream control signals, respectively.

In the following description, for purposes of explanation, numerous examples and specific details are set forth in order to provide a thorough understanding of embodiments of the present disclosure. Particular embodiments as defined by the claims may include some or all of the features in these examples alone or in combination with other features described below, and may further include modifications and equivalents of the features and concepts described herein.

Amplifiers, such as audio amplifiers, are well known and are used extensively to amplify signals, such as audio signals. Designing an amplifier generally requires balancing two competing concerns. The first concern is fidelity, which relates to the accuracy with which the amplifier reproduces received signals (e.g., received audio signals). The second concern is power efficiency, which relates to the power consumption of the amplifier under various operating conditions. Amplifier embodiments described herein balance acceptable fidelity with acceptable power consumption, for example, for use in handheld portable devices, such as mobile phones, personal digital assistants, tablet computers, and the like.

Figure 2:
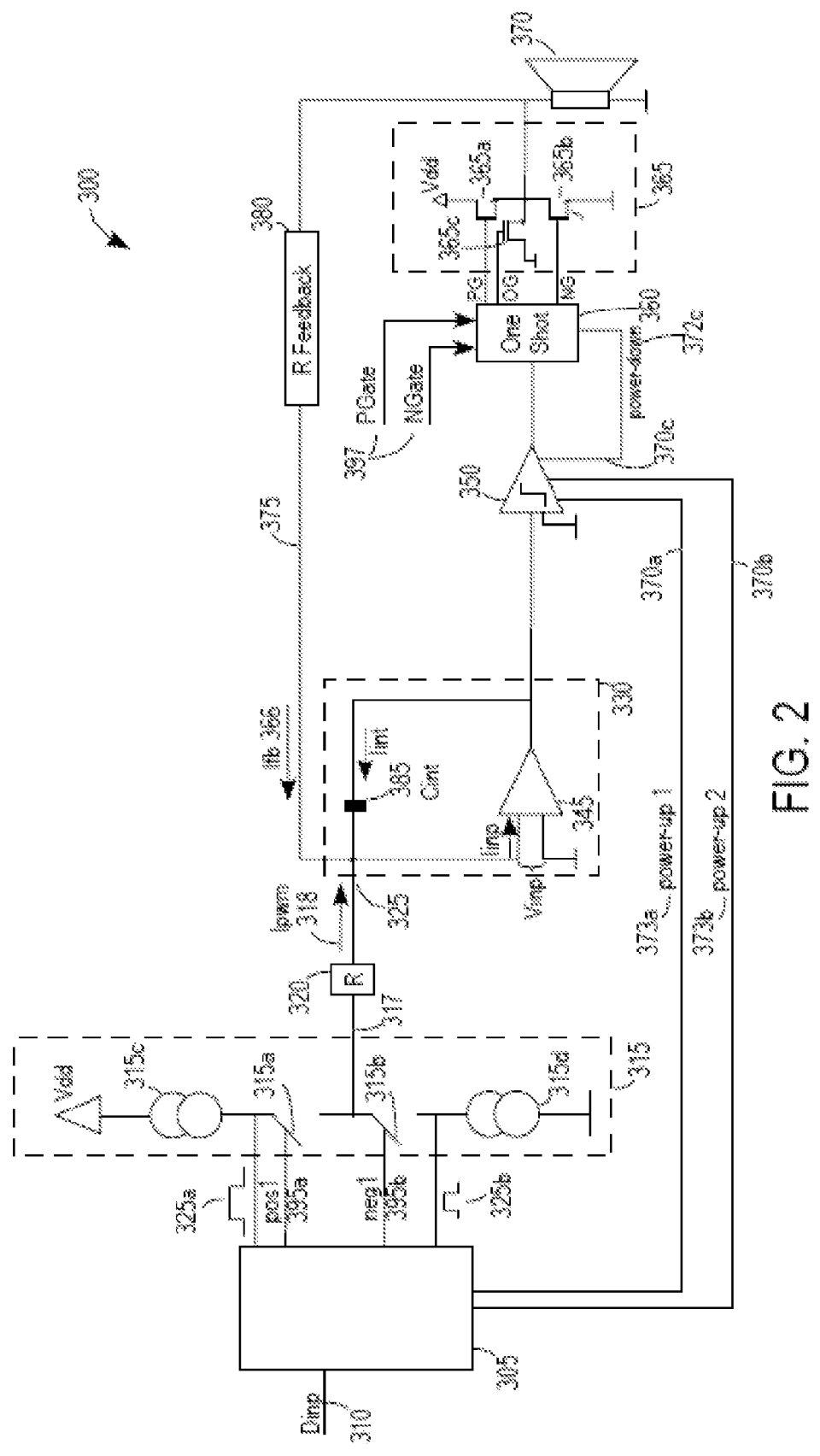

FIG. 2 is a simplified schematic of a digital amplifier 300 according to one embodiment. Digital amplifier 300 includes a signal generator 305, which is configured to receive a digital signal (Dinp) 310. Digital signal 310 may be a digital audio signal. Signal generator 305 may be a digital signal processor and may include a pulse width modulator and a subsequent sigma-delta circuit for processing digital signal 310. Signal generator 305 includes an output stage 315 coupled to an input resistor 320. Output stage 315 includes an output 317. According to some embodiments, input resistor 320 forms a portion of output stage 315 and signal generator 305. Input resistor 320 is coupled between output 317 of output stage 315 and an input 325 of an integrator 330. Integrator 330 may include an op-amp 345. A first input of op-amp 345 is coupled to the input 325 of integrator 330. Op-amp 345 includes a second input, which may be tied to a reference voltage, such as ground, −Vdd, etc.

An output of integrator 330 is coupled to a first input of a comparator 350. Comparator 350 includes a second input, which may be tied to a reference voltage, such as ground, −Vdd. An output of comparator 350 is coupled to an input of a one shot circuit 360. One shot circuit 360 is configured to control an output stage 365 of digital amplifier 300 where the output stage 365 is configured to transfer amplified signal (e.g., amplified audio signals) to a load 370 (e.g., a speaker). Output stage 365 may include a pull-up transistor 365*a*, a pull-down transistor 365*b*, and a tri-state transistor 365*c*, which are configured to generate a tri-level signal (high, low, and tri-state) based on respective control signals PG (positive gate), NG (negative gate), and OG (output gate) received from one shot circuit 360. The PG control signal may be configured to control the pull-up transistor, the OG control signal may be configured to control the tri-state transistor, and the NG signal may be configured to control the pull-down transistor.

According to one embodiment, digital amplifier 300 includes a first control path 370*a* from signal generator 305 to comparator 350 and a second control path 370*b* from the signal generator to comparator 350. The first and the second control paths may be configured to transfer a first set of control signals from the signal generator to comparator 350. The first set of control signals may include a first power-on signal 372*a* (labeled "power-on 1" in FIG. 2) and a second power-on signal 372*b* (labeled "power-on 2" in FIG. 2). According to some embodiments, digital amplifier 300 may include a single control path (rather than two control paths) between the signal generator and comparator 350 that may be configured to transfer both the first power-on signal and the second power-on signal to comparator 350.

Digital amplifier 300 may further include a third control path 370*b* from one-shot circuit 360 to comparator 350. The third control path is configured to transfer a second set of control signals to comparator 350. The second set of control signals may include a power-down signal 372*b* (labeled power-down in FIG. 2). The control signals transferred from the signal generator and the one-shot circuit to comparator 350 may be configured to control a power state of comparator 350. A power state may be a powered-off state, a low-power state, a powered-on state, etc. Control of the power state of comparator 350 is described in further detail below.

According to one embodiment, a feedback circuit path 375 feeds a feedback current from an output of output stage 365 to the first input of the first op-amp 345. Feedback circuit path 375 includes a feedback resistor 380 configured to convert a feedback voltage from output stage 365 to a feedback current (Ifb) 366. Integrator 330 further includes an integration capacitor (Cint) 385 configured to integrate a difference between an input current (Ipwm) 318 (described in further detail below) and feedback current 366.

As described briefly above, signal generator 305 is configured to receive digital signal 310 and perform processing on the digital signal to generate first and second pulse width modulated (PWM) signals 325a and 325b. The positive and negative signals 395a and 395b are generated by the signal generator and are configured to control whether the first or the second PWM signal is transferred to output 317 of output stage 315.

Output stage 315 may include switches 315a and 315b, which are controlled by the positive and negative signals applied to the switches to place either the first PWM signal 325a or the second PWM signal 325b onto output 317. A pull-up current source 315c may be coupled to switch 315a and a pull-down current source 315d may be coupled to switch 315b to couple either the pull-up current source or the pull-down current source to output 317.

The voltages of the first and the second PWM signals are converted to the PWM current signal Ipwm 318 by input resistor 320. Integrator 330 is configured to integrate the difference between Ipwm and Ifb onto Cint 385 as described briefly above.

According to one embodiment, subsequent to amplification of the first and second PWM signals (amplified PWM signals) by integrator 330, the amplified PWM signals are applied to the first input of comparator 350. The second input of comparator 350 is tied to a reference voltage Vref, which may be ground. If a voltage level of the amplified PWM signals applied to comparator 350 is greater than the reference voltage Vref, the output signal of comparator 350 is set to a high level, and if the voltage of the amplified PWM signals are less than the reference voltage Vref, the output signal of comparator 350 is set to a low level, which is less than the high level. Comparator 350 may be powered by supply voltage Vdd and −Vdd.

One shot circuit 360 is configured to receive the high level and the low level signals output by comparator 350 and may receive additional signals, such as timing signals from the signal generator for controlling the timing of asserting control signals PG, OG, and NG to output stage 365. As discussed briefly above, output stage 365 is configured to generate a tri-level signal based on the assertion of control signals PG, OG, and NG respectively on pull-up transistor 365a, tri-state transistor 365c, and pull-down transistor 365b. According to one embodiment, the output of output stage 365 is filtered by a filter to remove high frequencies from the output signal of output stage 365. Digital amplifier 300 may include a low-pass filter, a band-pass filter, or other filter configured to perform the described filtering. According to one embodiment, the load 370 (e.g., a speaker) includes the described filter and the output of output stage 365 may be applied directly to the load.

Control of the power states of comparator 350 is described in further detail immediately below. Comparator 350 may be a relatively high-power circuit configured for relatively high-frequency operation. To reduce power consumption of comparator 350, digital amplifier 300 is configured to power-on comparator 350 to put comparator 350 in a power-on state if comparator 350 is supposed to compare a signal received from integrator 330 with a reference voltage, and is further configured to power-down comparator 350 to put comparator 350 in a low-power state if comparator 350 is not supposed to be comparing a signal received from integrator 330 to the reference voltage. Alternatively, digital amplifier 300 may be configured to power-down comparator 350 to a powered-off state rather than a low-power state. More specifically, digital amplifier 300 may be configured to power-on comparator 350 a relatively short time before comparator 350 is supposed to make a comparison and power-down comparator 350 a relatively short time after comparator 350 has made a comparison.

In a low-power state comparator 350 is configured to draw a relatively small amount of current, and in a power-down state comparator 350 is configured not to draw current. In the low-power state comparator 350 may draw a relatively small amount of current to keep various circuits in comparator 350 powered-on where the various circuits that remain powered on may have a relatively long power-up time from a power-down state. In the low-power state comparator 350 is configured to draw considerably less current (e.g., 10% or less) than in the powered-on state as will be will understood by those of skill in the art.

According to one embodiment, signal generator 305 is configured apply the first power-up signal to comparator 350 to power-up comparator 350 if switch 315a is closed and the first PWM signal 325a is transferred to the output of output stage 315. The first power-up signal may be applied to comparator 350 by signal generator 305 so that comparator 350 has sufficient time to power-up from a low-power state or a power-down state so that comparator 350 can compare the first PWM single to the reference voltage after the first PWM signal is converted to a PWM current signal, integrated by integrator 330, and the amplified PWM signal is transferred to comparator 350. The first power-up signal may be a "copy" of the positive signal 395a applied to switch 315a and may be temporally retarded or temporally advanced, as needed, relative to positive signal 395a so that comparator 350 may sufficiently power-up for performing a comparison.

According to one embodiment, signal generator 305 is configured apply the second power-up signal to comparator 350 to power-up the comparator if switch 315b is closed and the second PWM signal 325b is transferred to the output of output stage 315. Similar to the first power-up signal, the second power-up signal may be applied to comparator 350 by signal generator 305 so that comparator 350 has sufficient time to power-up from a low-power state or a power-down state so that comparator 350 can compare the second PWM single to the reference voltage after the second PWM signal is converted to a PWM current signal, integrated by integrator 330, and the amplified PWM signal is transferred to comparator 350. The second power-up signal may be a "copy" of the negative signal 395b applied to switch 315b and may be temporally retarded or temporally advanced, as needed, relative to negative signal 395b so that comparator 350 may sufficiently power-up for performing a comparison.

The assertion of the first power-up signal and the positive signal by signal generator 305 may be based on a timing of the rising edges of the first PWM signal. Similarly, the assertion of the second power-up signal and the negative signal by signal generator 305 may be based on a timing of the rising edges of the second PWM signal. The first power-up signal, the second power-up signal, the positive signal, and the negative signal are each "upstream" signals and are generated and applied by signal generator 305 temporally before comparator 350 is configured to receive the upstream signals from signal generator 305 and operate on the upstream signal. As referred to herein, upstream signals are generated and/or processed in a processing stream by a circuit in the processing stream that process the upstream signals temporally before another circuit in the processing stream processes the upstream signals.

According to one embodiment, after comparator 350 has performed a comparison the first or the second PWM signal, digital amplifier 300 is configured to power-down comparator 350. According to one embodiment, the one-shot circuit is configured to apply power-down signal 372c to comparator 350 to power-down the comparator. The power-down signal may be applied to comparator 350 after the comparator has performed a comparison. According to one embodiment, the one-shot circuit is configured to receive a set of one-shot control signals 397 (e.g., labeled as Pgate and Ngate in FIG. 2) from signal generator 305 for controlling the temporal assertion and the temporal de-assertion of the PG, the OG, and the NG signals on the pull-up transistor, the tri-state transistor, and the pull-down transistor, respectively. According to one embodiment, the one-shot circuit is configured to generate the power-down signal based on one or more of the one-shot control signals received from signal generator 305. The power-down signal may be temporally retarded or temporally advanced, as needed, relative to one or more of the one-shot control signals so that comparator 350 may power-down relatively quickly after comparator 350 has performed a comparison. The power-down signal is a "downstream" signal and is generated and applied by the one-shot circuit temporally after comparator 350 is configured to perform a processing operation on a received signal (e.g., the amplified PWM signals) and temporally after comparator 350 receives the upstream signals from signal generator 305. As referred to herein, downstream signals are generated and/or processed in a processing stream by a circuit in the processing stream temporally after other circuits in the processing stream processes signals.

Figure 3:
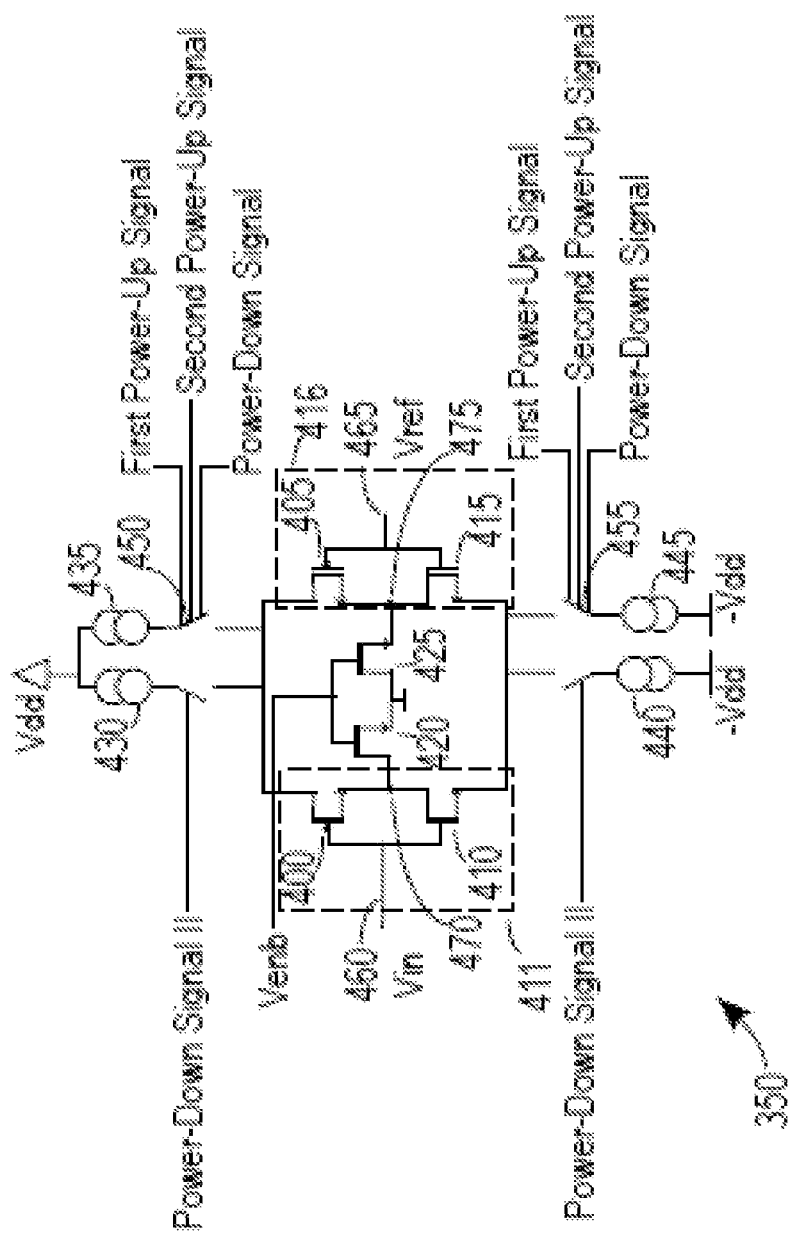
FIG. 3 is a simplified schematic of a comparator according to one embodiment.

FIG. 3 is a simplified schematic of comparator 350 (e.g., a fully differential comparator) according to one embodiment. Comparator 350 may include first and second pull-up transistors 400 and 405, respectively, which may be pMOS-FETs, and may include first and second pull-down transistors 410 and 415, respectively, which may be nMOSFETs. The first and the second pull-up transistors 400 and 405 (pMOSFETs) are the positive differential stage portion of the comparator, and the first and the second pull-down transistors 410 and 415 are the negative differential stage of the comparator and form a fully differential comparator. Comparator 350 may further include first and second load transistors 420 and 425, which may also be MOSFETs. Comparator 350 may also include a low-power pull-up (LPPU) current source 430, a high-power pull-up (HPPU) current source 435, a low-power pull-down (LPPD) current source 440, and a high-power pull-down (HPPD) current source 445. LPPU current source 430 and HPPU current source 435 may be tied to Vdd (e.g., +1.8 volts). LPPD current source 440 and HPPD current source 445 may be tied to ground, −Vdd (e.g., −1.8 volts), etc. Comparator 350 further includes a first set of switches 450 and a second set of switches 455. While the first set of switches and the second set of switches is each generally shown as a single switch, it will be understood by those of skill in the art that the first and the second set of switches may be implemented via a variety switch designs, which may each include one or more transistors configured to perform the switching described herein.

Comparator 350 further includes a first input node 460 configured to receive the first and the second amplified PWM signals from integrator 330. First input node 460 is coupled to the gates of both the first pull-up transistors 400 and the first pull-down transistor 410. Comparator 350 also includes a second input node 465 configured to receive the reference voltage, e.g., Vref. The second input node is coupled to the gates of both the second pull-up transistors 405 and second pull-down transistor 415. Comparator 350 includes first and second output nodes 470 and 475.

According to one embodiment, first pull-up transistor 400 includes a first source-drain region (e.g., a source region) coupled to LPPU current source 430 and is switch coupled to the HPPU current source 435 via the set of switches 450. The first pull-up transistor 400 includes a second source drain region (e.g., a drain region) coupled to a first source-drain region (e.g., a drain region) of first pull-down transistor 410. A second source-drain region (e.g., a source region) of the first pull-down transistor is coupled to LPPD current source 440 and is switch coupled to the HPPD current source 445 via the set of switches 455. According to a further embodiment, the first source-drain region of first pull-up transistor 400 and the first source-drain region of second pull-up transistor 405 are also switched coupled to the LPPU current source 430 via a set of switches 451. According to another further embodiment, the second source-drain region of first pull-down transistor 410 and the source-drain region second pull-down transistor 415 are switched coupled to the LPPD current source 440 via a set of switches 456.

The first pull-up transistor 400 and the first pull down transistor 410 form a complimentary input stage 411. The complimentary input stage 411 provides that output node 470 is driven to an output state (either high or low) regardless of whether Vin 460 is high or low as. That is, the first pull-up transistor 400 (e.g., pMOS) and the first pull-down transistor 410 (e.g., nMOS) are complimentary and drive the output node to the output state for Vin 460 being high or low. Therefore, the output node may be driven to the output state relatively quickly as compared to a circuit in which the output node floats to a high state or a low state.

According to a further embodiment, the first source-drain region of the first pull-up transistor 400, which is coupled to the LPPU current source 430 and the HPPU current source 435, is a source region, and the second source-drain region of the first pull-down transistor 410, which is coupled to the LPPD current source 440 and the HPPD current source 445, is also a source region. Current supplied by the LPPU current source 430 and the HPPU current source 435 is referred to sometimes as the "head current." Current supplied by the LPPD current source 440 and the HPPD current source 445 is referred to sometimes as the "tail current." Coupling (also referred to as closing switches) the source regions of the first pull-up transistor 400 and the first pull-down transistor 410 to the current sources 430, 435, 440, and 445 provides that the first pull-up transistor 400 and the first pull-down transistor 410 switch relatively quickly compared to other configurations of the first pull-up transistor 400 and the first pull-down transistor 410.

The second pull-up transistor 405 and the second pull down transistor 415 form a complimentary reference stage 416. The complimentary reference stage 416 provides that output node 475 is driven to an output state (either high or low) so that the output state of output node 475 is relatively quickly driven to the output state.

According to a further embodiment, the first source-drain region of the second pull-up transistor 405, which is coupled to the LPPU current source 430 and the HPPU current source 435, is a source region, and the second source-drain region of the second pull-down transistor 415, which is coupled to the LPPD current source 440 and the HPPU current source 445, is also a source region. Coupling the source regions of the second pull-up transistor 405 and the second pull-down transistor 415 to the current sources 430, 435, 440, and 445 provides that the second pull-up transistor 405 and the second pull-down transistor 415 switch relatively quickly compared to other configurations of the second pull-up transistor 405 and the second pull-down transistor 415.

According to one embodiment, second pull-up transistor 405 includes a first source-drain region coupled to LPPU current source 430 and is switch coupled to the HPPU current source 435 via the set of switches 450. The first source-drain region of the second pull-up transistor is also coupled to the first source-drain region of the first pull-up transistor. The second pull-up transistor includes a second source drain region coupled to a first source-drain region of second pull-down transistor 415. A second source-drain region of the second pull-down transistor is coupled to LPPD current source 440 and is switch coupled to the HPPD current source 445 via the set of switches 455. The second source-drain region of the second pull-down transistor is also coupled to the second source-drain region of the first pull-down transistor.

The first output node 470 is coupled between the second source-drain region of the first pull-up transistor and the first source-drain region of the first pull-down transistor. The second output node 475 is coupled between the second source-drain region of the second pull-up transistor and the first source-drain region of the second pull-down transistor.

Gates of the first and second load transistors 420 and 425 are coupled to an enable input 480, which may be configured to receive an enable signal from integrator 330, a previous comparator stage, etc. A first source-drain region of the first load transistor is coupled to first output node 470, and a second source-drain region of the first load transistor is coupled to a first source drain region of the second load transistor 425 and to a reference voltage, e.g., ground, −Vdd, etc. A second source-drain region of the second load transistor is coupled to second output node 475.

According to one embodiment, the first and the second load transistors 420 and 425 provide a load impedance that is less than the output impedance at the output node 470 provided by the drain nodes of the first pull-up transistor 400 and the first pull-down transistor 410. The first and the second load transistors 420 and 425 may be considered series loads, or series resistors. The first and the second load transistors 420 and 425 also provide a load impedance that is less than the output impedance at the output node 475 provided by the drain nodes of the second pull-up transistor 405 and the second pull-down transistor 415. For example, the load impedance of the load transistors 420 and 425 may be approximately ten to twenty times less than the output impedance at the output node 470 provided by the drain regions of the first pull-up transistor 400 and the first pull-down transistor 410, and may be approximately ten to twenty times less than the output impedance at the output node 475 provided by the drain regions of the second pull-up transistor 405 and the second pull-down transistor 415. Providing the relatively low impedance of load transistors 420 and 425 to the reference voltage between load transistors 420 and 425 inhibits instability at the output stages 470 and 475 and therefore provides for relatively fast switching of the output states of the output nodes 470 and 475.

According to one embodiment, the first set of switches 450 is configured to receive the first power-up signal and the second power-up signal for coupling (also referred to herein as closing a switch) the HPPU current source 435 to the first source-drain regions of both the first and second pull-up transistors 400 and 405. More specifically, the first power-up signal and the second power-up signal may each be configured to independently couple the HPPU current source to the first source-drain regions of both the first and the second pull-up transistors 400 and 405. The first set of switches 450 may be configured to receive the power-down signal to de-couple (also referred to herein as opening a switch) the HPPU current source from the first source-drain regions of both the first and second pull-up transistors 400 and 405. According to one embodiment, the first and the second power-up signals are applied asynchronously with respect to the power-down signal.

The second set of switches 455 is configured to receive the first power-up signal and the second power-up signal for coupling the HPPD current source 445 to the second source-drain regions of both the first and second pull-down transistors 410 and 415. More specifically, the first power-up signal and the second power-up signal may each be configured to independently couple the HPPD current source to the second source-drain regions of both the first and second the pull-down transistors 410 and 415. The second set of switches 455 may be configured to receive the power-down signal to de-couple the HPPD current source from the second source-drain regions of both the first and second pull-down transistors 410 and 415.

With the HPPU current source coupled to the first source-drain regions of the first and second pull-up transistors 400 and 405, and with the HPPD current source coupled to the second source-drain regions of the first and second pull-down transistors 410 and 415, the comparator is configure to be in the powered-on state via current supplied by the four current sources HPPU, LPPU, HPPD, and LPPD. According to one embodiment, the HPPU current source is configured to provide a relatively higher amount of power to the comparator than the LPPU current source. For example, the HPPU current source may be configured to provide 90% more power to the comparator than the LPPU current source where the LPPU current source may provide 10% or less of the power to the comparator than the HPPU current source. Similarly, the HPPD current source is configured to provide a relatively higher amount of power (e.g., power from sinking current) to the comparator than the LPPD current source. For example, the HPPD current source may be configured to provide 90% more power to the comparator than the LPPD current source where the LPPU current source may provide 10% or less of the power to the comparator than the HPPD current source.

As briefly described above, the power-down signal is configured to control the first and the second set of switches to decouple the HPPU current source from the first and second pull-up transistors, and decoupled the HPPD current source from the first and second pull-down transistors. With the HPPU current source and the HPPD current source decoupled from their associated transistors, the comparator is placed in the lower-power state with the LPPU current source and the LPPD current source configured to power the comparator in the low-power state. The LPPU current source and the LPPD current source are configured to provide sufficient power to maintain a potential bias on various circuits of the comparator so that the comparator may be powered on relatively quickly to the power-on state.

According to one embodiment, the sets of switches 451 and 456 may be configured to receive a second power-down signal (power-down signal II) for coupling (also referred to as closing switches) and decoupling (also referred to as opening switches) the LPPU current source 430 and the LPPD current source 440. In the de-coupled mode of the HPPU current source 435, the HPPD current source 445, the LPPU current source 430, and the LPPD current source 440, comparator 350 may be placed in a power-down state where the comparator does not draw current from the HPPU current source 435, the HPPD current source 445, the LPPU current source 430, and the LPPD current source 440.

According to one embodiment, i) providing for the LPPU current source 430 and the HPPU current source 435 to be coupled to the source regions of the first and the second pull-up transistors 400 and 405, ii) providing for the LPPD current source 440 and the HPPD current source 445 to be coupled to the source regions of the first and the second pull-down transistors 410 and 415, iii) providing for a complimentary input stage, iv) providing for a complimentary reference stage, and v) providing for the load transistors to a reference voltage, comparator 350 may be configured to power on relatively quickly, and switch the output state of the output nodes 470 and 475 relatively quickly. For example, the comparator may operate at approximately 500 kilohertz or more, where the comparator may be in the power-on state for approximately 50 nanoseconds and in the low-power state for the remainder of the duty cycle. Embodiments of the comparator described herein provide relatively large improvements in switching speeds compared to traditional comparators.

Figure 4:
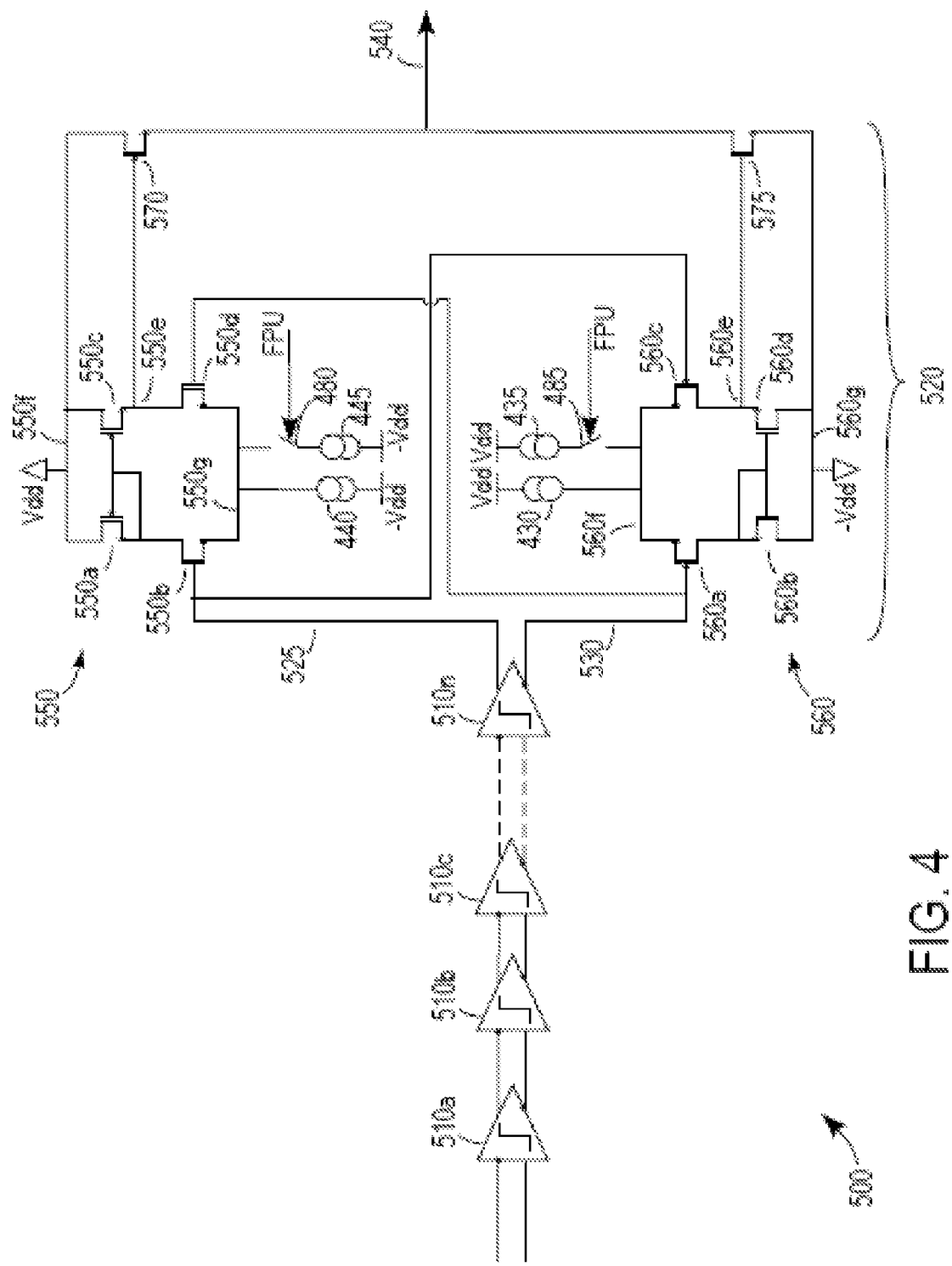
FIG. 4 is a simplified schematic of a comparator circuit according to one embodiment.

FIG. 4 is a simplified schematic of a comparator circuit 500 according to one embodiment. Comparator circuit 500 includes a plurality of comparators 510 where each comparator is labeled with the base reference number 510 and an alphabetic suffix (a, b, c . . . n). Each comparator 510a to 510n may include a comparator 350 described above and shown in in FIG. 3. Each comparator 510a to 510n may be a fully differential comparator (e.g., comparator 350) for receiving a positive input and a negative input, and for outputting a positive output and a negative output. According to one embodiment, each comparator 510a to 510n has a relatively small gain, e.g., a gain of about 3-5, and therefore has a relatively fast switching speed compared to comparators having a higher gain. By providing a series of comparators 510a . . . 510n with relatively low gain, the series of comparators may provide relatively fast switching for a relatively high gain as compared to a single traditional comparators providing the relatively high gain.

According to one embodiment, comparator circuit 500 includes an output stage 520 where output stage 520 includes a positive input 525, which is configured to receive a positive input from comparator 510n, and includes a negative input 530, which is configured to receive a negative input from comparator 510n. Output stage 520 is configured to combine a positive input received at positive input 525 and a negative input received at negative input 530 onto a single output 540. Output stage 520 may be configured to provide rail-to-rail drive to output 540 for comparators 510a . . . 510n. Output stage 520 includes a first combiner stage 550 for pulling a high output signal to the high rail (e.g., +Vdd) and includes a second combiner stage 560 for pulling a low output signal to the low rail (e.g., −Vdd). First combiner stage 550 may be a first current mirror, and second combiner stage 565 may be a second current mirror. For convenience, the first combiner stage 550 is referred to as the first current mirror 550, and the second combiner stage 560 is referred to as the first current mirror 560.

The first current mirror 550 includes a first pull-up transistor 550a, a first pull-down transistor 550b, a second pull-up transistor 550c, and a second pull-down transistors 550d where the first pull-up transistor 550a and the first pull-down transistor 550b are a first branch of the first current mirror 550, and the second pull-up transistor 550c and the second pull-down transistors 550d are a second branch of the first current mirror 550.

The second current mirror 560 includes a first pull-up transistor 560a, a first pull-down transistor 560b, a second pull-up transistor 560c, and a second pull-down transistors 560d where the first pull-up transistor 560a and the first pull-down transistor 560b are a first branch of the first current mirror 560, and the second pull-up transistor 560c and the second pull-down transistors 560d are a second branch of the first current mirror 560.

Positive input 525 may be coupled to the gate of first pull-down transistor 550b of first current mirror 550 and the gate of second pull-up transistor 560d of second current mirror 560. Negative input 530 may be coupled to the gate of the first pull-up transistor 560a of first current mirror 550 and the gate of second pull-down transistor 550d of second current mirror 560.

An output node 550e of the first current mirror 550 is coupled to a gate of a pull-up output transistor 570, which is configured to pull up the single output 540 to +Vdd (minus a diode drop) if a positive output is asserted to the output stage 520 by comparator 510n. An output node 560e of the second current mirror 560 is coupled to a gate of a pull-down output transistor 575, which is configured to pull down the single output 540 to −Vdd (minus a diode drop) if a negative output is asserted to the output stage 520 by comparator 510n.

A "top" 550f of the first current mirror 550 may be tied to Vdd and a "bottom" 550f of the first current mirror 550 may be tied to the LPPD current source 440 and the HPPD current source 445. According to one embodiment, the bottom 550g of the first current mirror 550 is switch coupled via a switch 580 to the HPPD current source 445. Switch 580 may be configured to receive the first power-up signal, the second power-up signal, and the power-down signal for powering up the first current mirror to the power-on state and powering down the first current mirror to the low-power state. The first power-up signal, the second power-up signal, and the power-down signal are generally labeled FPU (fast power up) in FIG. 4.

A "top" 560f of the second current mirror 560 may be tied to the LPPD current source 440 and the HPPD current source 445, and a "bottom" 560g of the second current mirror 560 may be tied to −Vdd. According to a further embodiment, the top 560f of the second current mirror 560 is switch coupled via a switch 585 to the HPPD current source 445. Switch 585 may be configured to receive the first power-up signal, the second power-up signal, and the power-down signal for powering up the second current mirror 560 to the power-on state and powering down the second current mirror 560 to the low-power state. Providing that the bottom 550g of the first current mirror 550 and the top 560f of the second current mirror 560 are tied to the LPPD current source 440 and are switch coupled to the HPPD current source further provides that output stage 520 may be placed in the power-on state and the low-power state substantially synchronously with the comparators 510a . . . 510n to conserve power, and may be switched from the low-power state to the power-on state relatively quickly because the first and the second current mirrors 550 and 560 are biased by the LPPU current source 430 and the LPPD 440 current sources for relatively fast power up.

The above description illustrates various embodiments along with examples of how aspects of the present disclosure may be implemented. The above examples and embodiments should not be deemed to be the only embodiments, and are presented to illustrate the flexibility and advantages of the embodiments as defined by the following claims. For example, it will be understood that while various embodiments are described herein as including MOSFETs, it will be understood that various transistor types may be used in implement the logic and operation of the circuits described herein. Based on the above disclosure and the following claims, other arrangements, embodiments, implementations, and equivalents may be employed without departing from the scope of the invention as defined by the claims.

What is claimed is:

1. A method comprising:
   accounting for an amount of transition time for a device to transition from a last state to a next state, wherein the amount of transition time is an amount of time between (i) an end time of the last state and (ii) a time when the device fully transitions to the next state, and wherein the last state and the next state are different ones of a first state, a second state and a powered off state;
   generating, via a processor, a first control signal based on the amount of transition time;
   receiving, at the device, a first output signal and the first control signal;
   consuming power, via the device, while operating in the first state and while operating in the second state, wherein the device consumes less power while operating in the first state than while operating in the second state;
   in response to the first control signal, transitioning the device to the second state based on a frequency of (i) the first output signal, or (ii) the first control signal;
   subsequent to transitioning to the second state, performing a function based on the first output signal;
   subsequent to performing the function, generating an output via the device;
   generating a feedback signal based on the output of the device; and
   based on the feedback signal, transitioning the device from the second state to either the first state or the powered off state.

2. The method of claim 1, wherein the frequency of the first output signal or the first control signal is based on an operating frequency of the processor.

3. The method of claim 1, further comprising:
   generating the feedback signal based on a resultant signal;
   generating the resultant signal via the device while performing the function; and
   based on a frequency of the feedback signal,
     transitioning the device from the second state to the first state, or
     transitioning the device from the second state to the powered off state.

4. The method of claim 1, further comprising:
   operating the device based on a duty cycle, wherein the duty cycle comprises a power on period and a power down period;
   performing the function during the power on period; and
   during the power down period,
     operating the device in the first state, or
     transitioning the device to the powered off state.

5. The method of claim 1, further comprising, during the first state:
   maintaining a first circuit element of the device in a powered on state; and
   maintaining a second circuit element of the device in a powered off state.

6. The method of claim 1, further comprising:
   receiving a digital signal; and
   generating the first output signal based on the digital signal, wherein the first output signal is a pulse width modulated signal.

7. The method of claim 1, further comprising:
   amplifying the first output signal, wherein the first output signal is a modulated signal;
   receiving the amplified first output signal at the device;
   subsequent to transitioning the device to the second state and while performing the function, comparing the amplified first output signal to a reference signal to generate a resultant signal;
   generating the feedback signal based on the resultant signal; and
   receiving the feedback signal at the device subsequent to generating the resultant signal.

8. The method of claim 7, further comprising integrating the first output signal to generate the amplified output signal received by the device.

9. The method of claim 8, further comprising:
   generating a second output signal and a second control signal;
   amplifying the second output signal;
   receiving the second control signal and the amplified second output signal;
   transitioning to the second state in response to the second control signal;
   subsequent to transitioning to the second state in response to the second control signal, comparing the amplified second output signal to the reference signal; and
   generating the resultant signal based on the comparison between the amplified second output signal and the reference signal.

10. The method of claim 9, further comprising:
    generating a third control signal and a fourth control signal;
    receiving the first output signal and the second output signal; and
    based on the third control signal and the fourth control signal, providing either the first output signal or the second output signal to a first circuit, wherein the first output signal is amplified via the first circuit.

11. The method of claim 9, further comprising:
    generating a plurality of output signals based on the resultant signal via a second circuit, wherein the feedback signal is generated via the second circuit; and
    driving a load based on the plurality of output signals.

12. The method of claim 7, further comprising:
    generating a second modulated signal, a second control signal, a third control signal, and a fourth control signal;
    amplifying the second modulated signal;
    receiving at the device the second control signal and the amplified second modulated signal;
    powering up the device in response to the second control signal;
    subsequent to powering up the device in response to the second control signal, comparing the amplified second modulated signal to the reference signal; and
    generating the resultant signal based on the comparison between the amplified second modulated signal and the reference signal; and
    generating a plurality of output signals based on (i) the resultant signal, (ii) the third control signal, and (iii) the fourth control signal.

13. The method of claim 7, further comprising:
in response to the first control signal, connecting a current source to a transistor and transferring current from the current source to the transistor; and
in response to the feedback signal, disconnecting the current source from the transistor.

14. The method of claim 13, further comprising:
generating a differential signal based on the resultant signal; and
receiving the differential signal at inputs of a circuit;
generating a second output signal based on the differential signal; and
providing the second output signal on the output of the circuit.

15. An apparatus comprising:
a processor configured to account for an amount of transition time for transitioning from a last state to a next state, wherein the amount of transition time is an amount of time between (i) an end time of the last state and (ii) a time when the device fully transitions to the next state, wherein the last state and the next state are different ones of a first state, a second state and a powered off state, and wherein the processor is configured to generate a control signal based on the amount of transition time;
means for consuming power while operating in the first state and while operating in the second state, wherein the means for consuming power consumes less power while operating in the first state than while operating in the second state, wherein the means for consuming power comprises
  means for (i) receiving a first output signal and the control signal, and (ii) in response to the control signal, transitioning to the second state based on a frequency of (a) the first output signal, or (b) the control signal, and
  means for, subsequent to transitioning to the second state, performing a function based on the first output signal, wherein the means for consuming power is configured to, subsequent to performing the function, generate an output; and
a first circuit configured to generate a feedback signal based on the output,
wherein the means for consuming power is configured to, based on the feedback signal, transition from the second state to either the first state or the powered off state.

16. The apparatus of claim 15, wherein the first circuit is configured to generate the feedback signal based on a resultant signal, wherein the means for consuming power is configured to:
generate the resultant signal while performing the function; and
based on a frequency of the feedback signal,
  transition from the second state to the first state, or
  transition from the second state to the powered off state.

17. The apparatus of claim 15, wherein:
the means for consuming power is configured to operate based on a duty cycle;
the duty cycle comprises a power on period and a power down period; and
the means for consuming power is configured to
  perform the function during the power on period, and
  during the power down period,
    operate in the first state, or
    transition to the powered off state.

18. The apparatus of claim 15, further comprising a second circuit configured to amplify the first output signal, wherein:
the first output signal is a modulated signal;
the means for consuming power is configured to
  receive the amplified first output signal, and
  subsequent to transitioning to the second state and while performing the function, compare the amplified first output signal to a reference signal to generate a resultant signal; and
the first circuit is configured to (i) generate the feedback signal based on the resultant signal, and (ii) receive the feedback signal subsequent to generating the resultant signal.

19. The apparatus of claim 15, further comprising a second circuit configured to generate a second output signal and a second control signal, wherein:
the first circuit is configured to integrate the first output signal to generate the amplified output signal;
the processor is configured to amplify the second output signal; and
the means for consuming power is configured to
  receive the second control signal and the amplified second output signal,
  transition to the second state in response to the second control signal,
  subsequent to transitioning to the second state in response to the second control signal, compare the amplified second output signal to a reference signal, and
  generate a resultant signal based on the comparison between the amplified second output signal and the reference signal.

20. The apparatus of claim 15, further comprising a second circuit configured to amplify the first output signal, wherein:
the first output signal is a modulated signal;
the processor is configured to generate a second modulated signal, a second control signal, a third control signal, and a fourth control signal;
the second circuit is configured to amplify the second modulated signal;
the means for consuming power is configured to
  receive the second control signal and the amplified second modulated signal,
  power up in response to the second control signal,
  subsequent to powering up in response to the second control signal, compare the amplified second modulated signal to a reference signal, and
  generate a resultant signal based on the comparison between the amplified second modulated signal and the reference signal; and
the first circuit is configured to generate a plurality of output signals based on (i) the resultant signal, (ii) the third control signal, and (iii) the fourth control signal.

21. The method of claim 1, further comprising:
receiving a digital signal at the processor; and
generating a pulse-width modulation signal based on the digital signal,
wherein the control signal (i) is a temporarily retarded or temporarily advanced version of the pulse-width modulation signal, and (ii) is generated based on the amount of transition time.

22. The method of claim 1, wherein:
the feedback signal is generated via a circuit and is received at the device; and
the circuit is separate from the device.

23. The method of claim 1, further comprising:
based on the amount of transition time, generating a plurality of control signals including the first control signal, a second control signal and a third control signal;
generating a plurality of pulse-width modulated signals;
supplying plurality of pulse-width modulated signals respectively to a first switch and a second switch;
controlling states of the first switch and the second switch based on respectively the second control signal and the third control signal; and
generating the first output signal based on (i) an output of the first switch, and (ii) an output of the second switch.

* * * * *